United States Patent
Parsadayan

(10) Patent No.: US 6,600,425 B1
(45) Date of Patent: Jul. 29, 2003

(54) METHOD AND APPARATUS FOR DETECTING AND RECORDING EPISODIC OVERLOADS IN A CIRCUIT

(75) Inventor: Walter Parsadayan, Lake Forest, CA (US)

(73) Assignee: Elite Access Systems, Inc., Lake Forest, CA (US)

( * ) Notice: Subject to any disclaimer, the term of this patent is extended or adjusted under 35 U.S.C. 154(b) by 0 days.

(21) Appl. No.: 10/100,642

(22) Filed: Mar. 19, 2002

(51) Int. Cl.[7] .............................................. G08B 21/00
(52) U.S. Cl. ...................... 340/660; 340/661; 340/662; 324/403
(58) Field of Search ................................. 340/660, 511, 340/600, 661, 662, 663; 324/403–414, 122, 123 R, 536; 702/58

(56) References Cited

U.S. PATENT DOCUMENTS 3,621,262 A * 11/1971 Lecuyer ...................... 250/214
3,744,045 A * 7/1973 Frink et al. .............. 340/248 R
4,117,526 A * 9/1978 Bates ........................... 361/92
5,051,733 A * 9/1991 Neuhouser ................... 340/660
5,805,070 A * 9/1998 Eriksson ...................... 340/662

* cited by examiner

Primary Examiner—Daniel J. Wu
Assistant Examiner—Phung Nguyen

(57) ABSTRACT

A apparatus for recording information on power surges in an electrical or electronic system is disclosed. The apparatus has a gas discharge tube connected between an input line of the electrical or electronic circuit protected and ground. The gas discharge tube is set to activate at a predetermined voltage. The gas discharge tube has adjacent to it a light sensor that reacts to discharges in the tube and the sensor in conjunction with enabling circuitry generates a signal representative of discharge of the gas discharge tube. The signal produced provides information on the time, magnitude and duration of discharges in the gas discharge tube which are in turn representative of the power surge experienced by the system.

11 Claims, 4 Drawing Sheets

METHOD AND APPARATUS FOR DETECTING AND RECORDING EPISODIC OVERLOADS IN A CIRCUIT

FIELD OF THE INVENTION

The present invention relates to an apparatus and method of detecting the occurrence of overloads in circuit and more particularly for detecting the time, duration and strength of an overload or power surge.

BACKGROUND OF THE INVENTION

The need to provide protection for electrical and electronic circuits and systems has existed from the advent of these systems in the late 1800's. To date a variety of devices have been developed to protect a circuit, electric or electronic system from damage or destruction by power or voltage surges.

One popular type of surge protection device in current use is the gas discharge tube. Gas discharge tubes are typically two lead devices with an anode and cathode lead. Typically one of the leads is connected to a power input lead of the system to be protected and the other connected to ground. When a surge occurs at the power input of the system to be protected the gas discharge tube diverts the surge to ground. The tube does this by ionization of gas within the tube. In effect the tube short circuits the surge to ground.

One of the short comings of these surge protection systems, in particular those that use a gas discharge tube is that no record is retained of the occurrence of a power surge. Retaining a record may be important in situations where the system to be protected is located in a remote location such a security gate system. Frequent power surges may indicate a variety of problems with the remote system that need to be addressed to prevent injury or eventual destruction of the system being protected.

Thus, what is needed is an efficient and economical system to record and analyze the occurrence of power surges. There is a further need to provide a system for recording and analyzing power surges that is cost effective to fabricate and implement.

SUMMARY

It is an objective of the present invention to provide and efficient and economical system to record and analyze the occurrence of power surges in a system. It is a further objective to provide a system for recording and analyzing power surges that is cost effective to manufacture and easy to implement.

The present invention accomplishes these and other objectives by providing an apparatus for detecting and recording episodic overloads in a circuit, the apparatus having: a) a gas discharge tube with at least a first and second terminal with the first terminal connected to an input line of a circuit and the second terminal connected to ground, the tube being configured to be activated when a voltage in the security circuit reaches a threshold level and at the threshold level and above the tube becomes active and diverts power from the circuit to ground causing a discharge in the gas discharge tube; b) a light sensitive sensor adjacent to the discharge tube and encased with the gas discharge tube in light impervious housing to thereby exclude ambient tight and make the light sensor subject to exposure only to light produced by the gas discharge tube; c) a diagnostic device connected to the light sensitive sensor wherein when the tight sensitive sensor reacts to light generated by activation of the gas discharge tube the sensor reacts in concert and produces a signal representative of the discharge of the gas discharge tube which the diagnostic device records information derived from the signal generated by the sensor; and d) wherein the information derived from the signal generated by the sensor and recorded by the diagnostic unit with respect to a discharge in the gas discharge tube includes a time of the discharge, an amplitude of the discharge and a duration of the discharge.

BRIEF DESCRIPTION OF THE DRAWINGS

The invention will be better understood by an examination of the following description, together with the accompanying drawings, in which.

DETAILED DESCRIPTION OF THE PREFERRED EMBODIMENT

Figure 1:
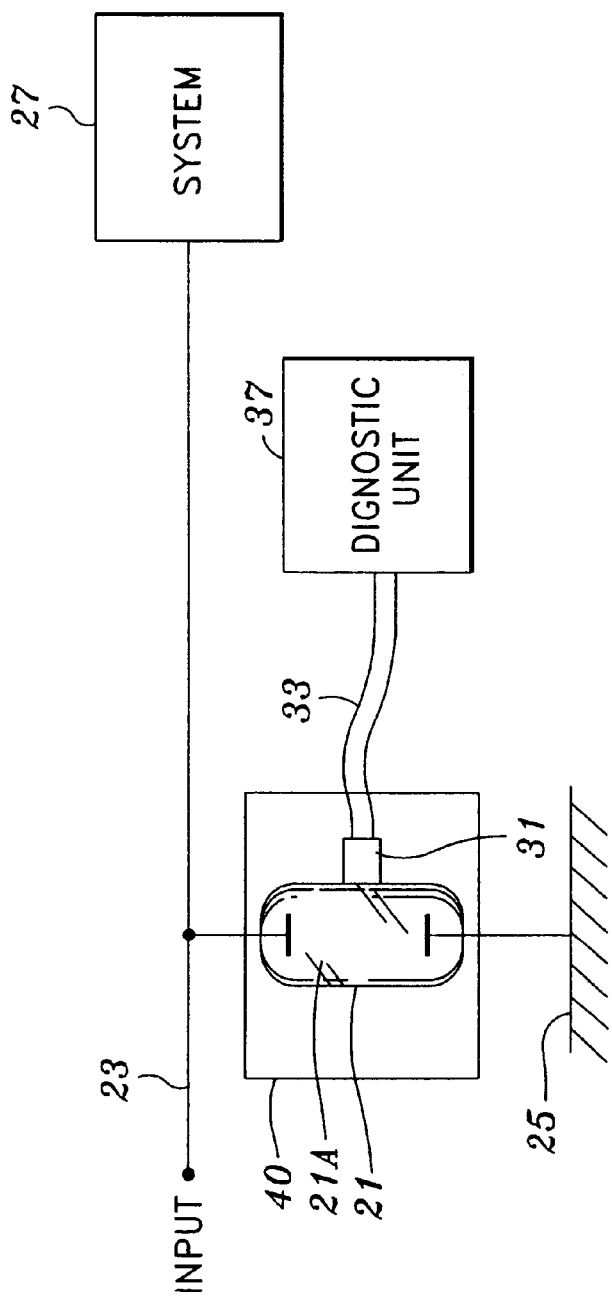
FIG. 1 is a schematic block type of diagram of the major functional components of a preferred embobodiment or implementation of the present invention.

The present invention provides a method and apparatus for monitoring the occurrence of overloads in an electrical or electronic circuit and maintaining a record of the duration, extent and time of a power surge or overload in the protected circuit. FIG. 1 is a schematic block diagram of the fundamental components of the system. Gas discharge tube 21 connects in a preferred embodiment of the invention to an input line 23 of a system 27 to be protected at one of the terminals of tube 21 and to ground 25 at its other terminal. Input line 23 supplies power to system 27. Input line could also be a data or command wire coming from a detector or a control center. In one version of the preferred embodiment the circuitry protected can be a security gate system; however, the invention can be used in a wide variety of systems.

Sensor 31 is placed adjacent to gas discharge tube 21 and connects by lines 33 to a diagnostic unit 37. Gas discharge tube 21 and sensor 31, in the preferred embodiment are encased in light impervious enclosure 40. Light impervious enclosure 40 shields gas discharge tube 21 and sensor 31 from ambient light. This is necessary since sensor 31, as will be discussed in more detail below is positioned to detect discharges in gas discharge tube 21 and generate a signal that is transmitted over line 33 to diagnostic unit 37. Diagnostic unit 37 analyzes the signal generated by sensor 31 and saves the information on the signal and its analysis for later retrieval.

As noted above, use of gas discharge tubes as power overload or surge protectors is well known the art. Gas discharge tubes of the type discussed herein are typically used to protect a circuit from switching surges, contact with foreign circuits or tightening induced surges. When a surge of electricity exceeds the breakdown voltage of the tube (surge spike over voltage) the gap 21A becomes intensely ionized and conduction takes place within a fraction of a second. The ionized gas in gas discharge tube 21 becomes a short circuit and remains so until the voltage returns to normal. Once the voltage returns to normal levels, gas discharge tube 21 returns to a high-impedance or off state. However, for use as a surge protector, ionization and deionization of the gas in tube 21 needs to be extremely fast. This is typically achieved by the type of gas used in the tube and the configuration of the tube. A variety of gases can be used including argon, kryton, helium etc. A detailed discussion of the appropriate gases to be use, the pressure in the tube and such other particulars of the gas discharge tube will not be discussed in this specification since these are well known in the art.

Depending on the size of the surge, i.e. its voltage, it will create a specific brightness and length of exposure in discharge tube 21. Thus, measuring the brightness and length of discharge in gas discharge tube 21 can be correlated to the voltage of the surge and its duration. Gas discharge tube 21 can be configured to activate when the circuitry it is attached to experiences a voltage surge above a preset amount. The actual threshold voltage can be set at a wide variety of voltages. In a preferred embodiment of the present invention it might be from 110 volts to 220 volts, or whatever threshold voltage level the circuit being protected by the gas discharge tube requires. A detailed discussion of how to configure the gas discharge tube to react to a specific power or voltage surge level will not be discussed herein since how to do this is welt known to those of ordinary skill in this art.

In a preferred embodiment of the present invention, gas discharge tube 21 will be used with a security gate system and the threshold surge voltage level could be anywhere from 120 volts to 220 volts or even higher depending on the requirements of the system. Most security gate systems are located outdoors often in an exposed position that makes them potential locations for lightening strikes.

Figure 2A:
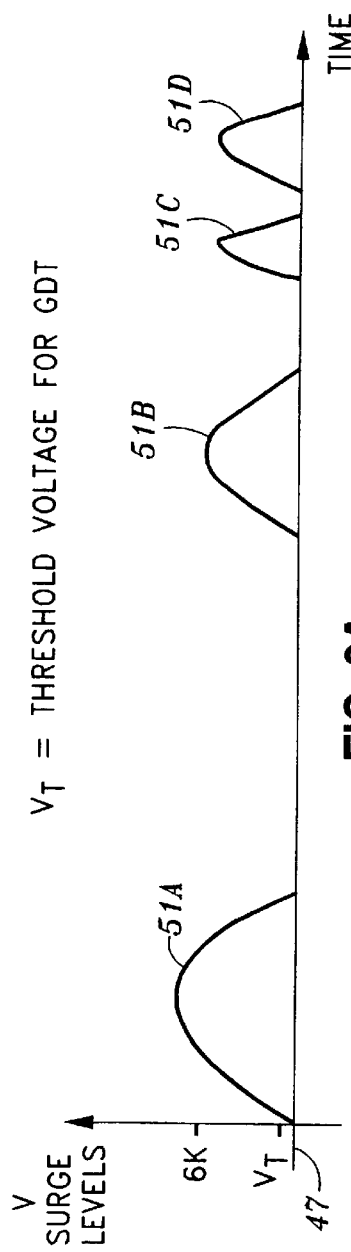
FIGS. 2A is a graph representative of discharges in the gas discharge tube over time.
Figure 2B:
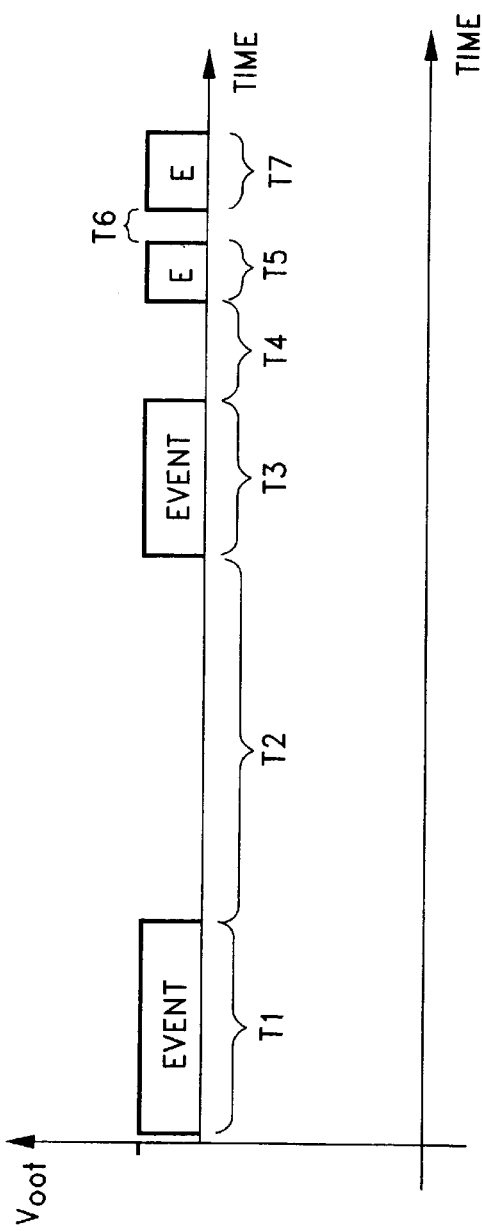
FIG. 2B is a graph representative of a recording by the system of events discharge in the gas discharge tube.

A variety of light responsive sensors can be used with the present system. Among those that would be appropriate are: photodiodes, phototransistors, photo-resistors, photo-detectors, or other type of photosensitive elements. As noted the sensors will be enclosed in a light tight compartment or enclosure 40 to prevent ambient light from creating false readings. FIGS. 2A and 2B provide an example of how a preferred embodiment of the system would function. FIG. 2A is a simple graph with time plotted along the x-axis and voltage level plotted along the y-axis. FIG. 2A provides examples of the actual recording of discharges occurring in gas discharge tube 21 over a period of time. FIG. 2B provides an example of detection of series of events by the sensor and the recording of the event by the system. As noted above a preset threshold voltage $V_T$ 47 would be set at which the gas discharge tube would activate. Assuming a surge occurs it would last for a period time, perhaps on the level of micro or mille seconds and thus the sensor would detect the activation of the discharge tube and generate a signal 51A FIG. 2A. In turn the system would record an event $T_1$ corresponding to the time of the event 51A. The system would record that nothing has occurred in time interval $T_2$. In turn at a later time a second event occurs 51B that activates the gas discharge tube and in turn the sensor detects it and the system records the event as $T_3$ FIG. 2B. Likewise on the occurrence of events 51C and 51D the sensor detects the occurrence of these events and the system records them as $T_5$ and $T_7$. The system will also have recorded that no events occurred during periods $T_4$ and $T_6$.

Figure 3:
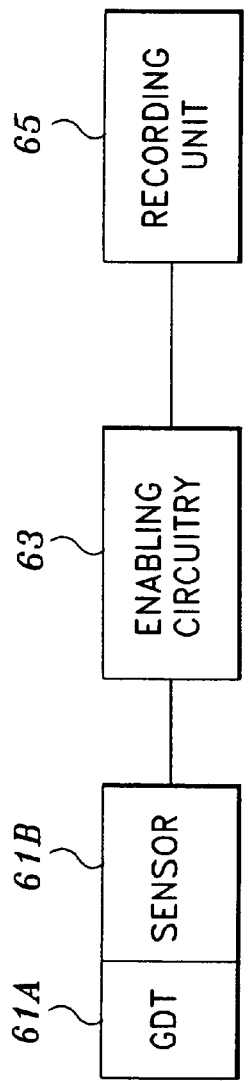
FIG. 3 is block diagram implementing one form of the detection circuit.

FIG. 3 is a block diagram of circuitry that would implement one form of the present invention. The gas discharge tube 61A and sensor 61B form one unit. The diagnostic unit is made up of enabling circuit 63 and recording unit 65. During operation when gas discharge tube 61A becomes active and emits light as the result of an overload, sensor 61B in response would go into a conductive state and enabling circuitry 63 would process the signal generated by sensor 61B. Enabling circuitry 61B would in turn produce a readable signal such as a high voltage reading during discharge that recording unit 79 can use to create the record of magnitude, duration and time of the overload. The actual signal produced by enabling circuit 63 and recorded by recording unit 65 would be similar to those depicted in FIGS. 2A or 2B. A detailed discussion of the exact enabling circuitry 63 is not included since once the concepts of the present invention are understood a person of ordinary skill in the art could design such circuitry without undue experimentation. The actual recording device could be a pen and graph printer or any other similar type of recording device. However, in the preferred embodiment it would be computer as will be explained in more detail below.

Figure 4:
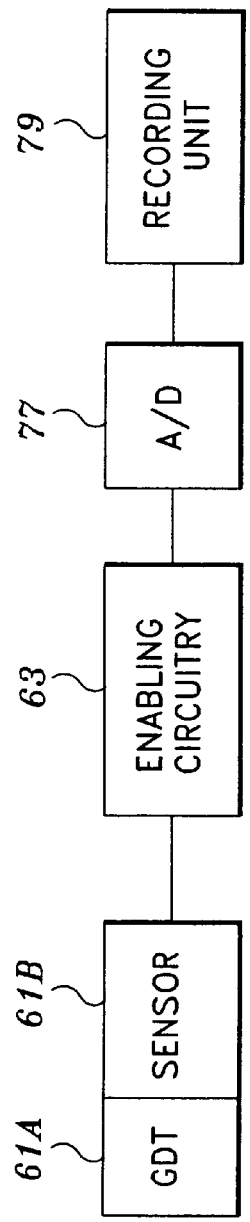
FIG. 4 is a block diagram implementing another form of the detection circuit.
Figure 5:
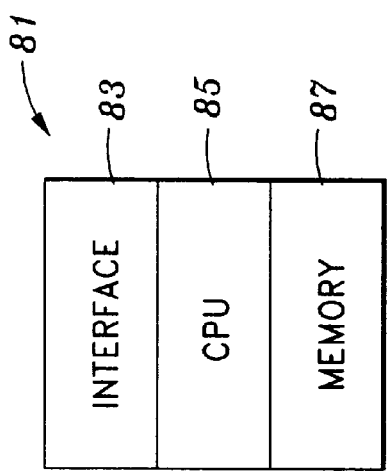
FIG. 5 is a block diagram of one type of recording unit.

FIG. 4 is an example of the circuitry that would be used to enable a digital diagnostic unit. The circuitry of FIG. 4 is the same as FIG. 3 with respect to gas discharge tube 61A and sensor 61B as well as enabling circuit 63. However, FIG. 4 includes and analog to digital converter 77 that would convert the signal generated by enabling circuit 63 from an analog to digital signal. Analog to digital converter 77 in turn connects to a recording unit 79 that would record the signal with the information on the magnitude, duration and time of the overload. Here again a detailed discussion of the exact circuitry that would enable is not included since once the concepts of the present invention are understood a person of ordinary skill in the art could design such circuitry without undue experimentation. The signal recorded by the unit for analysis would be similar to those depicted in FIGS. 2A and 2B. In a preferred embodiment recording unit 79 would be a computer 81 that at a minimum would include an interface 83 that would receive the signal for analog to digital converter 77 and in turn pass the signal along to CPU 85. In turn CPU 85 in turn store information on the time, duration and magnitude of the overload in memory 87. Naturally, computer 81 would be running appropriate software for this purpose. A detailed discussion of this aspect of the invention is not included since the technique of using a computer as a recording device of a sensor unit is well known in the art.

Figure 6:
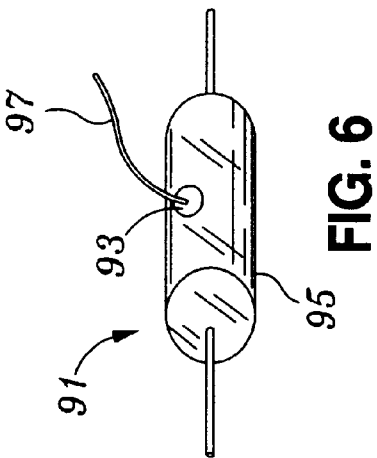
FIG. 6 is a block type of diagram of another variation of the sensor gas discharge tube unit.

FIG. 6 provides an example of a variation of the gas discharge tube sensor unit. In the version depicted in FIG. 6 gas discharge tube 91 and sensor 93 are simply joined to each other in a light communicative relation and are not placed in an enclosure to eliminate interference from ambient light. Gas discharge tube is covered with a light impervious coating 95 to prevent ambient tight from interfering with sensor 93. Sensor 93 it self has a light impervious coating on its sensing surfaces that are not in a light communicative relation with gas discharge tube 91.

Figure 7:
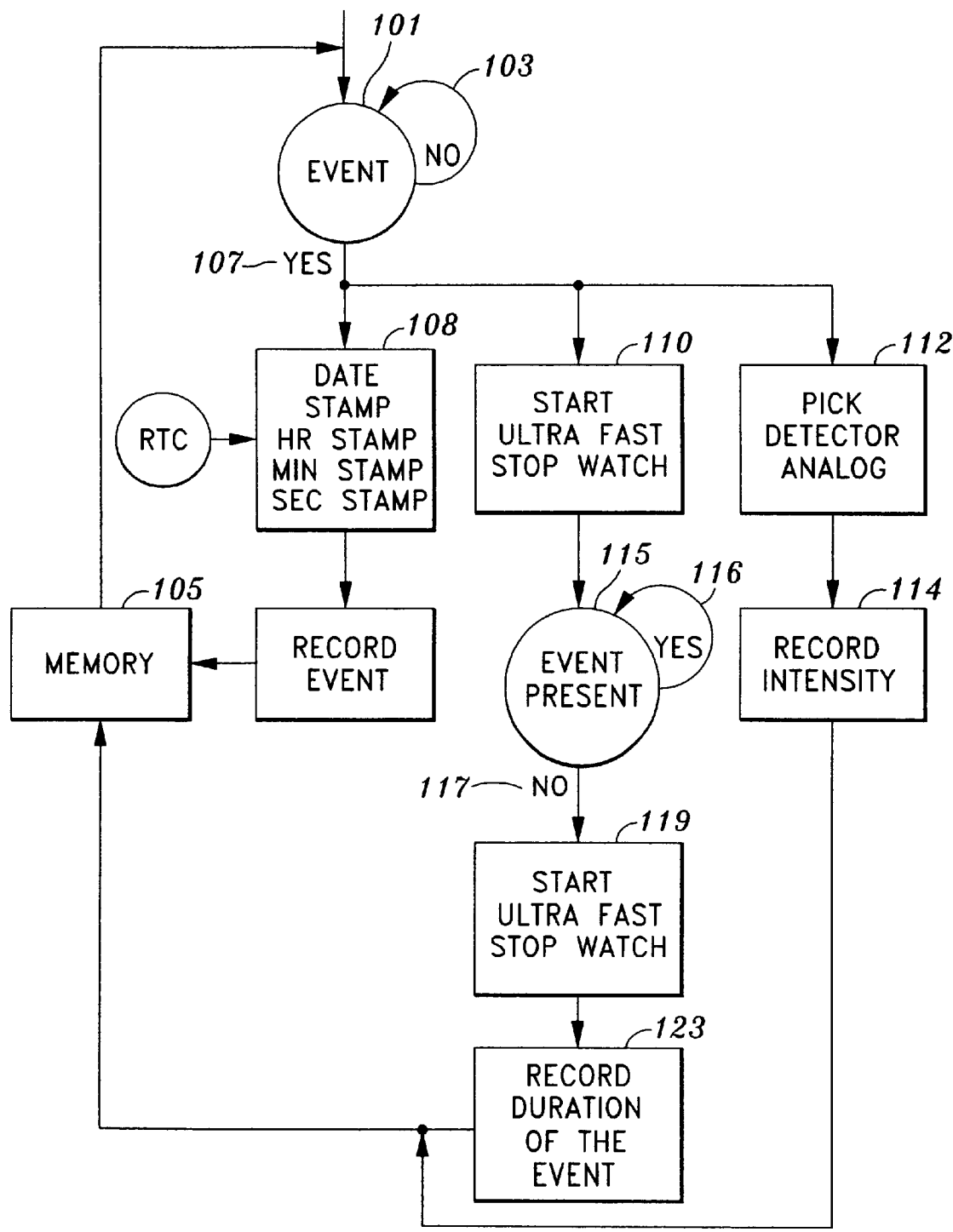
FIG. 7 is a flow chart of one preferred method of operation of the system of the present invention.

FIG. 7 is a flow chart that depicts how the system of the present invention would function in one preferred embodiment of the present invention. The system will be constantly monitoring events on a periodic basis, generally at the micro or mille second level. If no event 103 occurs during a measuring time period the system will note this and the fact will be noted in the memory of the diagnostic unit. When an event occurs 107, as the result of the sensor detecting a discharge in the gas discharge tube, the system date and time stamps the event at the same time the diagnostic unit starts an ultra fast stop watch 110 that times at the mille or even micro second level. At the same time the ultra fast stopwatch is started peak detector analog 112 starts and a record of the intensity is created that is sent to the memory 105 of the system. At the same time the record of the intensity of the event is being recorded ultra fast stop watch 110 continues to run. While the stopwatch is running the diagnostic unit periodically checks to see if the event is still in progress 115. If it is 116 ultra stopwatch continues to run. However, as soon as the event is not present 117 ultra fast stop watch stops 119 and the duration of the event 123 is recorded in memory together with the information on the intensity of the event. This process can be implemented in a number of ways, such as by hardwire circuitry or use of a computer in conjunction with the sensors and appropriate software.

While the invention has been particularly shown and described with reference to a preferred embodiment thereof, it will be understood by those skilled in the art that various changes in form and detail may be made to it without departing from the spirit and scope of the invention.

What is claimed is:

1. An apparatus for detecting and recording episodic overloads in a circuit, said apparatus comprising:
   a) a gas discharge tube with at least a first and second terminal with said first terminal connected to an input line of a circuit and said second terminal connected to ground, said tube being configured to be activated when a voltage in said security circuit reaches a threshold level and at said threshold Level and above said tube becomes active and diverts power from said circuit to ground causing a discharge in said gas discharge tube;
   b) a light sensitive sensor adjacent to said discharge tube and encased with said gas discharge tube in light impervious housing to thereby exclude ambient light and make said light sensor subject to exposure only to light produced by said gas discharge tube; and
   c) a diagnostic device connected to said light sensitive sensor wherein when said light sensitive sensor reacts to light generated by activation of said gas discharge tube said sensor reacts in concert and produces a signal representative of the discharge of said gas discharge tube which said diagnostic device records information derived from the signal generated by said sensor.

2. The apparatus of claim 1 wherein the information recorded by said diagnostic device includes the luminosity of the discharge of said discharge tube.

3. The apparatus of claim 2 wherein the information regarding luminosity is analyzed to determine an average voltage of a voltage level that causes said gas discharge tube to activate.

4. The apparatus of claim 1 wherein the information recorded by said diagnostic device includes the duration of any discharge of said gas discharge tube.

5. The apparatus of claim 1 wherein said light sensitive sensor is selected from a group consisting of photodiodes, phototransistors, photo-resistors and photo-detectors.

6. The apparatus of claim 1 wherein the information derived from the signal generated by said sensor and recorded by said diagnostic unit with respect to a discharge in said gas discharge tube includes a time of a discharge, an amplitude of said discharge and a duration of said discharge.

7. The system of claim 1 wherein multiple events of discharge of said gas discharge tube are recorded.

8. An apparatus for detecting and recording episodic overloads in a circuit, said apparatus comprising:
   a) a gas discharge tube with at least a first and second terminal with said first terminal connected to an input line of a circuit and said second terminal connected to ground, said tube being configured to be activated when a voltage in said security circuit reaches a threshold level and at said threshold level and above said tube becomes active and diverts power from said circuit to ground causing a discharge in said gas discharge tube;
   b) a light sensitive sensor adjacent to said discharge tube and encased with said gas discharge tube in light impervious housing to thereby exclude ambient light and make said light sensor subject to exposure only to light produced by said gas discharge tube;
   c) a diagnostic device connected to said light sensitive sensor wherein when said light sensitive sensor reacts to light generated by activation of said gas discharge tube said sensor reacts in concert and produces a signal representative of the discharge of said gas discharge tube which said diagnostic device records information derived from the signal generated by said sensor; and
   d) wherein the information derived from the signal generated by said sensor and recorded by said diagnostic unit with respect to a discharge in said gas discharge tube includes a time of the discharge, an amplitude of the discharge and a duration of the discharge.

9. The apparatus of claim 8 wherein said light sensitive sensor is selected from a group consisting of photodiodes, phototransistors, photo-resistors and photo-detectors.

10. The apparatus of claim 8 wherein multiple events of discharge of said gas discharge tube are recorded.

11. The apparatus of claim 8 wherein information on an event of discharge is sent to a computer that saves the information of the discharge in an associated memory for later retrieval.

* * * * *